United States Patent
Wolf et al.

(10) Patent No.: US 7,807,608 B2
(45) Date of Patent: Oct. 5, 2010

(54) COATED CONDUCTOR AND POLYCRYSTALLINE FILMS USEFUL FOR THE PRODUCTION OF HIGH TEMPERATURES SUPERCONDUCTOR LAYERS

(75) Inventors: Andre Wolf, Oyten (DE); Dirk Isfort, Heidenheim (DE); Mark O. Rikel, Hürth (DE)

(73) Assignee: Nexans, Paris (FR)

( * ) Notice: Subject to any disclaimer, the term of this patent is extended or adjusted under 35 U.S.C. 154(b) by 11 days.

(21) Appl. No.: 11/799,468

(22) Filed: May 1, 2007

(65) Prior Publication Data

US 2008/0039330 A1    Feb. 14, 2008

(30) Foreign Application Priority Data

May 18, 2006 (EP) ................................. 06300491

(51) Int. Cl.
*H01B 12/00* (2006.01)
(52) U.S. Cl. ....................... 505/238; 505/100; 505/237; 117/54
(58) Field of Classification Search ................. 505/100, 505/473; 117/54
See application file for complete search history.

(56) References Cited

U.S. PATENT DOCUMENTS

| | | | | |
|---|---|---|---|---|
| 6,106,959 A | * | 8/2000 | Vance et al. | 428/623 |
| 6,258,467 B1 | * | 7/2001 | Subramanian | 428/633 |
| 6,270,908 B1 | * | 8/2001 | Williams et al. | 428/469 |
| 2005/0217568 A1 | * | 10/2005 | Rupich et al. | 117/101 |
| 2007/0026247 A1 | * | 2/2007 | Paranthaman et al. | 428/469 |

* cited by examiner

*Primary Examiner*—Stanley Silverman
*Assistant Examiner*—Paul A Wartalowicz
(74) *Attorney, Agent, or Firm*—Sofer & Haroun, LLP

(57) ABSTRACT

Coated conductors have a substrate, a high temperature superconductor layer and at least one or more buffer layers, wherein at least one of the buffer layers is a template for biaxially orienting the high temperature superconductor layer wherein the template is composed of a polycrystalline film consisting of a non-stoichiometric material having the nominal chemical formula $A_{2-x}B_{2+x}O_7$ with B being at least one selected from Zr, Hf, Sn, Pb and Ti; A being at least one selected from La, Ce, Pr, Nd, Pm, Sm, Eu, Gd, Tb, Dy, Ho, Er, Y, Tm, Yb and Lu; and $x \neq 0$; and wherein the substrate is textured.

11 Claims, No Drawings

COATED CONDUCTOR AND POLYCRYSTALLINE FILMS USEFUL FOR THE PRODUCTION OF HIGH TEMPERATURES SUPERCONDUCTOR LAYERS

RELATED APPLICATION

This application claims the benefit of priority from European Patent Application No. 06 300 491.5, filed on May 18, 2006, which is incorporated by reference.

FIELD OF THE INVENTION

The present invention relates to coated conductors and polycrystalline films useful for the production of high temperature superconductor layers. In particular, the present invention relates to such polycrystalline films suitable as templates for transferring a desired crystal orientation to a high temperature superconductor layer grown thereon. Further, the present invention relates to coated conductors comprising a substrate, a buffer layer and a high temperature superconductor layer whereas the polycrystalline film can be used as a template for inducing lattice orientation of the high temperature superconductor layer.

BACKGROUND

One major concern in the production of high temperature superconductor layers or films is the achievement of a current carrying capacity sufficiently high for practical use.

Intrinsic to high temperature superconductor (htsc) material is the electrical anisotropy with high electric conductivity in a,b-direction and only low electrical conductivity in c-direction. In addition, grain boundaries with more than 4°-5° misalignment angle act as weak links. The critical current density for grain boundaries above that misalignment angle decreases exponentially as a function of that angle.

Consequently, single crystal high temperature superconductor material has good current carrying capacity in a,b-direction whereas in polycrystalline material a drastic drop of the current carrying capacity is observed.

It has been shown that the reason for this drop is misalignment of the individual grains or crystals constituting the polycrystalline film in a,b-direction. For solving the problem of a,b-axis misalignment intensive studies have been made.

There are well known techniques for epitaxially growing single crystal films using a substrate having a crystallographic lattice parameter close to that of the high temperature superconductor film to be grown.

In these cases also the substrate itself is single crystalline.

Here, the crystal orientation of the substrate is transferred to the growing film. That is, the substrate serves as a template for inducing the desired orientation of the film.

However, suitable single crystalline substrates are very expensive and the surface area is only limited so that large scale production of high temperature superconductor films with long length is not possible and, consequently, the commercial importance of these techniques is only minor.

Similar to single crystal films also polycrystalline films when grown on a polycrystalline template of a material with similar lattice parameters adopt the crystalline orientation of the template material and, thus, can be oriented. That is, when using a polycrystalline template with grains of suitable orientation the orientation can be transferred to a polycrystalline film grown on the template provided that the lattice parameters of the template are sufficiently similar, i.e. matching, to those of the film to be grown.

Generally, high temperature superconductors are typically defined as having a critical temperature (tc) above the temperature of liquid nitrogen. Examples of such high temperature superconductors are superconducting ceramic oxides belonging to the bismuth-strontium-calcium-copper-oxide family (BSCCO), yttrium-barium-copper-oxide family (YBCO) and thalium-barium-calcium-copper-oxide family (TBCCO-family).

All of these superconducters are cuprates and crystallise with perovskite structure.

The crystal structure is characterised in having copper oxide planes which define the current flow path.

In the production of coated conductors YBCO-based high temperatures superconductor materials, such as $Y_1Ba_2Cu_3O$ (YBCO-123), are commonly used nowadays.

Summarising, to be suitable as a template for growing high temperature superconductor films with improved current carrying capacity a polycrystalline film must have
1. good a, b-alignment as well as
2. a crystal structure with lattice parameters matching to those of the high temperature superconductor material.

Alignment in a,b-direction is also referred to as biaxial texture.

"Good a, b-alignment" means that the misalignment angle between the a-axis and b-axis, respectively, of different grains is as small as possible; in particular grains grown with 90° tilted orientation, the so-called a,b-grains, should be absent.

A polycrystalline film with only very low misalignment angles is referred to to have a "sharp" biaxial texture.

Techniques for biaxially texturing buffer layers to be suitable as templates used in the production of coated conductors are generally known. In particular, there are two major techniques.
1. In the "ion beam assisted deposition" (IBAD) an oxide layer is deposited on a polycrystalline metal tape by a vacuum deposition technique like pulsed laser deposition (PLD) or evaporation. During deposition the growing film is hit by a monoenergetic Ar-ion beam under a specific angle for removing grains with undesired orientation from the film. By this technique in particular materials such as yttrium-stabilized zirconia (YSZ), MgO and $Gd_2Zr_2O_7$ are biaxially textured.
2. There is known the "inclined substrate deposition" technique (ISD). Also in this technique an oxide layer is deposited on a polycrystalline metal tape by a vacuum deposition technique such as PLD or evaporation. Deposition is done such that the trajectories of impinging vaporized metal species have a certain angle with the substrate normal. This technique is usually applied for biaxially texturing MgO.

Though these techniques allow the use of non-oriented substrates, they generally suffer from either only low production rate or poor texture quality. Further they are vacuum processes with the need of specific equipment with demanding production conditions.

A specific example for a buffer layer used in coated conductors with YBCO-123 superconductor films is yttrium-stabilized zirconia (YSZ) obtained by ion beam assisted deposition as referred to above.

YBCO as well as YSZ crystallize with a cubic face centred lattice. As reported in EP 1 178 129 the distance between an atom located at a corner and an atom located at the centre of a face of the cubic lattice is 0.363 nm for YSZ and for YBCO-123 0.381 nm. Though the distance in YSZ is considered to be fairly close to those of YBCO-123, nevertheless, an intermediate layer of $Y_2O_3$ is required with a distance of 0.375 nm for bridging the difference in lattice size between YSZ and YBCO-123.

For avoiding the need of a second layer with closer lattice match EP 1 178 129 suggests using a material of pyrochlore type structure as buffer layer said material having a general formula of AZrO or AHfO with A being selected from Y, Yb, Tm, Er, Ho, Dy, Eu, Gd, Sm, Nd, Pr, Ce and La, and having a cubic lattice such as YBCO.

In the general formula the relative proportion of A and Zr and Hf, respectively, is 1:1 with a possible variation of from 0.1:0.9 to 0.9 to 0.1 provided that the cubic crystal system is maintained.

As specific examples of suitable materials with pyrochlore type structure reference is made to compounds of the formula $A_2Zr_2O_7$ and $A_2Hf_2O_7$ with A as defined above and with the distance between the atoms closest together decreasing from 0.381 nm ($La_2Zr_2O_7$, $La_2Hf_2O_7$) to 0.366 nm ($Yb_2Zr_2O_7$, $Yb_2Hf_2O_7$).

Due to the identical distance of 0.381 nm with YBCO the La compounds are considered to be the most promising candidates for serving as template in transferring biaxial texture to growing YBCO film.

Consequently EP 1 178 129 teaches that for epitaxial growth identical lattice parameters are preferable.

As is the case with YSZ buffer layer in EP 1 178 129 biaxial texturing of the buffer layer is carried out by ion beam assisted deposition with the drawbacks as set out above.

In view of the above, further improvement for obtaining buffer layers with suitably sharp texture is highly desired in order to grow superconductor films with biaxially texture of good quality to achieve superior current carrying capacities.

Moreover, a method for attaining a coated conductor in a practically long length with a high temperature superconductor film with sharp biaxial texture and, thus, high current carrying capacity, in a simple and effective manner is needed allowing production of such long length coated conductors in large scale with economically reasonable costs.

In particular there is a desire to have a method for obtaining suitably textured templates not requiring vacuum based techniques for obtaining the template.

SUMMARY

According to the present invention these problems are solved by providing coated conductors comprising a substrate, a high temperature superconductor layer and at least one or more buffer layers wherein at least one of the buffer layers is a template with a texture for biaxially orienting the high temperature superconductor layer, wherein the template is composed of a polycrystalline film consisting of a material having the nominal chemical formula $A_{2-x}B_{2+x}O_7$ with B being at least one selected from Zr, Hf, Sn, Pb and Ti; A being at least on selected from La, Ce, Pr, Nd, Pm, Sm, Eu, Gd, Tb, Dy, Ho, Er, Y, Tm, Yb and Lu; and x≠0; wherein the substrate is textured.

According to another aspect the present invention provides a polycrystalline film having the nominal chemical formula

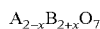

with B being at least one selected from Zr, Hf, Sn, Pb and Ti and A being at least one selected from of La, Ce, Pr, Nd, Pm, Sm, Eu, Gd, Tb, Dy, Ho, Er, Y, Tm, Yb and Lu, x≠0, wherein the proportional ratio A:B varies in direction of the film thickness.

According to a further aspect the present invention provides a method for adjusting the lattice parameters of a polycrystalline film having the nominal chemical formula $A_{2-x}B_{2+x}O_7$ with A, B and x as defined above by variation of the proportional ratio of A:B.

According to a yet further aspect the present invention relates to a coated conductor comprising at least a substrate, a high temperature superconductor layer, and one or more buffer layers, wherein at least one of the buffer layers serves as template, wherein the template is composed of a material of nominal chemical formula $A_{2-x}B_{2+x}O7$ with A, B and x being as defined above, wherein the proportional ratio of A:B is varied in direction of the thickness of the template.

According to a yet further aspect of the present invention the template is a multilayer stack with at least two layers with differing proportional ratios of A:B and/or different A-atoms and/or B-atoms.

Furthermore the polycrystalline film of the present invention can be obtained by metal organic deposition.

Within the meaning of the present invention the term
"epitaxy" refers to the oriented growth of a film, preferably thin film, on a substrate or template of at least essentially same orientation;
"lattice parameter" refers to the length of the lattice constants (a, b, c) of a unit cell of a given crystal system, in particular of the cubic system;
"lattice mismatch" refers to the deviation of corresponding lattice constants of two different crystalline materials, in particular of the polycrystalline film of the present invention and a high temperature superconductor film or, in case of a multilayer polycrystalline film, of two adjacent layers in the multilayer stack;
"texture" refers to the average orientation distribution of the crystals or grains of a polycrystalline material; the degree of texture (sharpness) being measured by x-ray diffraction (rocking curves, phi-scans) measuring the orientation distribution function of the grains, wherein the degree of texture corresponds to the value of the full width at half maximum (FWHM) of a x-ray pole figure of the polycrystalline material, wherein the lower the FWHM-value the sharper the texture; typically for YBCO the (103)-pole-figure is measured;
"biaxial texture" refers to the orientation of individual crystals or grains of a polycrystalline film within the a,b-plane;
"texture sharpening" refers to an increase of the average orientation of a film when the film grows thicker.

DETAILED DESCRIPTION

The present invention is based on the observation that a sharpening effect of the texture of a film grown on a template such as a buffer layer or substrate is obtained when there is a certain lattice mismatch between the lattice parameter of the template and that of the grown film.

That is, the biaxial texture of a film can be improved if the lattice parameter of the film is slightly different, i. e. slightly greater or smaller, than the corresponding lattice parameter of the template so that the orientation of the film is sharpened compared to the case that there is no such lattice mismatch between the template and the film grown or that the mismatch is too great.

According to a general rule suitable mismatch should be in the order of 1% based on corresponding lattice parameters.

However, it has been shown that the optimum value for the lattice mismatch for obtaining the sharpening effect depends on the substrate and film material, for example in terms of surface energy and formation enthalpy, as well as of the specific coating process and growth conditions etc. In view of these parameters the optimum value for each specific combination of material should be empirically determined.

For example, when using dip-coating for applying a film on a template, such as e.g. sol-gel techniques in epitaxial growth mismatches of up to 10% between substrate and buffer have been found to be suitable.

According to the present invention the polycrystalline film forming the template is of a material of nominal chemical formula $A_{2-x}B_{2+x}O_7$ with A being at least one selected from La, Ce, Pr, Nd, Pm, Sm, Eu, Gd, Tb, Dy, HO, Er, Y, Tm, Yb and Lu; B being at least one selected from Zr, Hf, Sn, Pb and Ti; and $x \neq 0$.

The material of the polycrystalline film of the present invention is derived from the as such known pyrochlore structure $A_2B_2O_7$, however being of non-stoichometric composition with respect to A and B, which means that the proportion of A is different from the proportion of B present in the material.

According to the present invention the lattice parameters of the polycrystalline film forming the template are adjusted by variation of x.

The influence of the variation of x on the lattice parameters depends on the size difference of the A-atoms and B-atoms.

As is clear, the similar the size of A-atoms and B-atoms the less the influence of the proportional variation of A-atoms and B-atoms present on the lattice parameters.

Thus, preferably, atoms A and B are selected to have a large atomic size difference in order to achieve a large effect.

The atomic size of the A-atoms is of from 0.95 Å (Angstrom) and 1.2 Å, and that of the B-atoms of from 0.6 Å to 0.8 Å.

Typically the atomic size ratio A:B should be within a range of 1.3 to 1.9.

A particularly preferred example for a suitable combination of A- and B-atoms (A; B) is La/Zr.

Preferably the material of the present invention crystallizes in the cubic crystal system. More preferably, the material shows a structure such as of pyrochlore, fluoride, monoclinic type etc.

According to the present invention "monoclinic type structure" refers to a lattice which is different from the cubic system in having only two equal axes with the third axis being different.

According to a preferred embodiment a combination of A-atoms and B-atoms is used which has a large cubic phase field in its phase diagram since the larger the phase field of a suitable phase within the phase diagram the more the variation possibilities of the proportion of A and B by variation of x without exceeding the desired phase field.

For the purposes of the present invention a suitable non-stoichometry of the material can be obtained with x being outside the range of from −0.05 to +0.05; preferably x is from above 0.05 to below 0.3 and, respectively, from less than −0.05 to more than −0.3, that is 0.05<x<0.3 and −0.3<x<−0.05, respectively.

The present invention allows easy and simple accommodation of the lattice parameters of the template to the optimum value for achieving the desired sharpening effect of the biaxial texture of the film to be grown by using A and B of different atomic size and by selecting x to be $\neq 0$.

Moreover, according to the present invention a template with graded lattice parameters can be provided by varying the proportional ratio of A:B in direction of the thickness of the film.

For example, the film with graded lattice parameter can be a multilayer stack with at least two layers composed of a material with nominal chemical formula $A_{2-x}B_{2+x}O_7$ wherein layers are deposited on top of each other with increasing or decreasing value of x resulting in layers with smaller (or bigger) lattice parameters than the underlying layer. Thereby the lattice mismatch between adjacent layers can be tailored in such a way that increasing sharpening is achieved in each layer compared to the respective underlying layer. In the result a superconductor film can be grown on such a film with graded lattice parameter having particularly improved biaxial texture sharpening.

Gradation of lattice parameter is also possible by using changing A-atoms and/or B-atoms over the film thickness or from layer to layer.

Further for gradation a combination of both, variation of proportional ratio A:B and change of at least one of A-atoms and B-atoms can be applied.

According to the present invention orientation of the polycrystalline film is achieved by using a substrate with appropriate texture.

Appropriately textured substrates for obtaining buffer layers with the correct buffer texture for growing oriented htsc films are well known.

For example a suitable technique for texturing substrates is referred to "rolling assisted biaxially textured substrate" (RABiTS). This process makes use of a suitably textured metallic substrate obtained by rolling and heat treating a metal of suitable crystal structure for recrystallization in the desired biaxial texture. This process is well known and can be used for texturing also substrates of long length with comparatively economic costs.

The correct buffer texture of the polycrystalline film of the present invention can be, thus, achieved using a substrate with the correct texture.

The RABiTS process starts from a substrate made of a material with similar or same crystal system than the film to be grown thereon.

In the production of coated conductors with YBCO htsc layer generally substrates of metals with cubic face centred crystal lattice are used. To be suitable as a template for coated conductors the metal should have a high melting point, low tendency to build oxides and reasonable mechanical strength. Examples of suitable materials are Nickel, copper and alloys thereof, e. g. NiW.

According to the present invention it is possible to tailor the lattice parameters of the material of the polycrystalline film used as template within the cubic phase by varying the stoichiometry of the two metals A and B within the limits of the cubic phase field as well as by selecting a suitable difference in atomic size of A and B. Thereby it is possible to adapt the lattice parameter of the polycrystalline film to the desired lattice mismatch for obtaining a high temperature superconductor layer with the desired sharp biaxial texture.

The adjustment of the lattice parameters of the polycrystalline film allows also growing the polycrystalline film with improved biaxial texture on the textured substrate which, in turn, results in texture sharpening of the high temperature superconductor film.

To this respect the use of a buffer layer with graded lattice parameters can be particularly useful. Here the lattice parameters of the face adjacent to the substrate can be selected to have a suitable mismatch with the substrate, the texture of subsequent layers can be adjusted to obtain sharpening of the texture of each individual layer grown on top of the layer below and, finally, the lattice parameters of the top layer can be adjusted to have a suitable mismatch with the lattice parameters of the high temperature superconductor film in order to obtain a sharp biaxial texture of the high temperature superconductor film.

That the lattice parameters of the buffer layer can be tailored to have a suitable mismatch with the substrate on one side and, on the other side, to have a suitable mismatch with the htsc film to be grown.

For example, according to the present invention polycrystalline films with A=La and B=Zr (LZO buffer layers) with different La/Zr stoichiometry can be obtained with improved low misalignment angle, in particular as low as 3.5° FWHM for the out-of-plane texture XRD pattern and 6° for the FWHM of the in-plane-texture XRD pattern. In comparison standard LZO buffers that do not exhibit a texture sharpening effect show a misalignment angle of 7.5° for the out-of-plane texture FWHM XRD pattern and 8° for the in-plane texture FWMH. High temperatures superconductor layers with such low misalignment angles are superior in view of high current carrying performance and with respect of superconductivity.

Generally the polycrystalline film as used in the present invention can be obtained by metal organic deposition (MOD) techniques such as reverse roll-coating, tensioned web-slot coating, meniscus roll-coating, knife over-roll coating, metering roll-coating, inkjet printing or dip-coating methods. This techniques are well known to those skilled in the art.

As a preferred dip-coating method reference is made to the so-called sol-gel route.

For example, the polycrystalline film composed of $A_{2-x}B_{2+x}O_7$ can be produced by the sol-gel route by deposition of gel-forming metal-organic compounds from a solution on a substrate. Hereby a stoichiometric mixture of suitable precursor compounds for A and B in an organic solvent can be used. The obtained fresh films are further dried, pyrolized (organic burnout) usually at temperatures between 200° C. and 500° C. Subsequently, crystallisation is carried out, wherein a temperature not exceeding half of the melting temperature of the desired final oxide film has been shown to be particularly useful. The growth process of the oxide film is a solid-state growth process, comparable to crystallization in amorphous glasses.

According to the approach of the present invention the buffer layers necessary as template can be obtained by simple metal organic deposition (MOD) techniques not requiring any vacuum equipment and, further, which methods can be easily adapted to continuous deposition of the polycrystalline film without restriction as to the length.

A further advantage is, that by these techniques the substrate can be provided with the necessary at least one buffer layer on both the front and back side of the substrate in one process step, so that the production of double sided coated conductors is possible.

For the deposition of the htsc layer any suitable method can be used. Examples are physical vapor deposition techniques such as pulsed laser deposition (PLD), sputtering evaporation and MOD such as the sol-gel-route.

For pulsed laser deposition of a htsc film of RE 123-type usually a ceramic RE 123 target is hit by a pulsed laser beam and material is evaporated stoichometrically and deposited on the buffer layer, with RE being rare earth element.

As to sputtering different sputtering techniques can be used such as high pressure magnetron sputtering, reactive sputtering using, for example, ceramic RE 123 targets.

As to evaporation either metals are evaporated thermally or by electron beam or ceramic RE 123 powder is evaporated by electron beam.

In the sol-gel-route preferably a modification called trifluoroacetateroute is used. Trifluoroacetates of the metals forming the superconductor e.g. Y, Ba, Cu, are dissolved in a suitable solvent such as methanol or another organic solvent. A wet coating technique is used to obtain a film on the substrate which is further dried, pyrolized and crystallized. Generally, also the well known sol-gel-route can be used.

For supporting the growth of the superconductor layer on the buffer layer appropriate intermediate layers can be used. Such intermediate layers can serve to facilitate the initial growth of the desired superconductor layer. Suitable intermediate layers are generally known. A preferred example is $CeO_2$.

Apart from the layers discussed above the coated conductor can comprise further layers such as buffer layers, if desired. For example, coated conductors usually comprises at least one buffer layer as a diffusion barrier for oxygen and for elements, such as metal ions, originating from the substrate.

In the following the present invention is further explained by way of examples. These examples are for illustration purposes of the principles of the present invention only and do not restrict the present invention.

EXAMPLES

A) Examples for suitable architectures of coated conductors of the present invention.

In the following A=La and B=Zr (LZ).

In the tables the left column shows the architecture of the coated conductor with indication of x for the buffer layers; in the right column suitable methods for obtaining the respective layer as well as suitable layer thicknesses are indicated.

The polycrystalline film of the present invention used as buffer layer referred to as LZO can be prepared by a sol-gel technique as follows.

The LZO precursors are prepared by weighing appropriate amounts of La-acetylacetonate, Zr-acetylacetonate and dissolving them (while heating and stirring) in propionic acid.

The LZO films are then dip-coated onto a metallic tape substrate either in a continuous fashion by pulling the tape through the precursor solution or in a stationary fashion when short samples are prepared.

The films are further dried and annealed at high temperature (typically 1 h at 1000° C.) under Ar/5% H2 gas mixture (forming gas) for crystallisation and epitaxial growth.

$CeO_2$ films can either be prepared by sol-gel methods or by electron beam evaporation. For the latter Ce metal can be evaporated by electron beam evaporation out of a water cooled crucible. The substrate is held at 650° C. to 750° C. and the background pressure of the chamber is in the range of 10-5 to 10-2 mbar with a certain partial pressure of $H_2O$ to adjust the oxidizing potential of the atmosphere in order to form stöchiometric $CeO_2$.

The YBCO films are preferably formed by using one of the following techniques:

hydro-thermal liquid phase epitaxy (HLPE)

electron beam evaporation (e-beam)

metal organic chemical vapor deposition (MOCVD)

trifluoroacetate metal organic deposition method (TFA-MOD)

| YBCO | HLPE, MOCVD, e-beam, MOD 100-3000 nm | | |
|---|---|---|---|
| CeO$_2$ | Sol-Gel, PVD 10-200 nm | YBCO | HLPE, MOCVD, e-beam, MOD 100-3000 nm |
| LZO x = 0.1 | Sol-Gel 1-250 nm | LZO x = 0.1 | Sol-Gel 1-250 nm |

| LZO x = 0.1 | Sol-Gel 1-250 nm | LZO x = 0.1 | Sol-Gel 1-250 nm |
|---|---|---|---|
| NiW | | NiW | |

| YBCO | HLPE, MOCVD, e-beam, MOD 100-3000 nm | | |
|---|---|---|---|
| 50-100 nm CeO$_2$ | Sol-Gel, PVD 10-200 nm | YBCO | HLPE, MOCVD, e-beam, MOD 100-3000 nm |
| LZO x = 0.16 | Sol-Gel 1-250 nm | LZO x = 0.16 | Sol-Gel 1-250 nm |
| LZO x = 0.05 | Sol-Gel 1-250 nm | LZO x = 0.05 | Sol-Gel 150 nm |
| NiW | | NiW | | with LZO being La$_{2+x}$Zr$_{2-x}$O$_7$

B) Example of texture improvement

| Architecture | FWHM ω | FWHM ω90 | FWHM Φ |
|---|---|---|---|
| 1) Texture improvement in out-of plane texture | | | |
| LZO x = 0.16 | 5.4 | 6.3 | 6.5 |
| LZO x = 0.05 | 6.1 | 8.2 | 7.1 |
| NiW | 7.4 | 10 | 6.6 |
| 2) Texture improvement in out-of-plane texture | | | |
| LZO x = 0.1 | 5.2 | 6 | 6.4 |
| LZO x = 0.1 | 5.9 | 7 | 7.3 |
| NiW | 7.6 | 9.1 | 6.5 |

The invention claimed is:

1. A coated conductor comprising:
a substrate, a high temperature superconductor layer and at least one or more buffer layers, wherein at least one of the buffer layers is a template for biaxially orienting the high temperature superconductor layer wherein the template is composed of a polycrystalline film made from a non-stoichiometric material having the nominal chemical formula $A_{2-x}B_{2+x}O_7$ with B being at least one selected from Zr, Hf, Sn, Pb and Ti; A being at least one selected from La, Ce, Pr, Nd, Pm, Sm, Eu, Gd, Tb, Dy, Ho, Er, Y, Tm, Yb and Lu; and x ≠ 0; wherein the substrate is textured and wherein the lattice parameters of the non-stoichiometric material of the polycrystalline film are adjusted to the lattice parameters of the superconductor layer to be grown by variation of x wherein x has a value of 0.05 <x<0.3 and −0.3 <x<−0.05, respectively.

2. A coated conductor according to claim 1, wherein in the direction of the thickness of the polycrystalline film, the proportional ratio of A:B is varied.

3. A coated conductor according to claim 2, wherein in the direction of the thickness of the polycrystalline film, the proportion of A is increased or decreased.

4. A coated conductor according to claim 1, wherein the template is a multilayer stack composed of two or more layers with different proportional ratios of A:B.

5. A coated conductor according to claim 1, wherein in the direction of the thickness of the polycrystalline film, at least one of A-atoms and B-atoms is changed.

6. A method for growing a high temperature superconductor layer, comprising the steps of:
growing of the high temperature superconductor layer on a polycrystalline film composed of a non-stoichiometric material with the nominal formula $A_{2-x}B_{2+x}O_7$ with B being at least one selected from Zr, Hf, Sn and Ti, A being at least one selected from La, Ce, Pr, Nd, Pm, Sm, Eu, Gd, Tb, Dy, Ho, Er, Y, Tm, Yb and Lu; and x ≠ 0, of A to B, wherein the lattice parameters of the non-stoichiometric material of the polycrystalline film are adjusted to the lattice parameters of the superconductor layer to be grown by variation of x.

7. A method for growing a high temperature superconductor layer according to claim 6, wherein x is outside the range of from −0.05 to +0.05.

8. A method for growing a high temperature superconductor layer according to claim 6, wherein x has a value of 0.05 <x<0.3 and −0.3 <x<−0.05, respectively.

9. A method according to claim 6, wherein the proportional ratio A:B within the polycrystalline film varies in direction of the thickness of the polycrystalline film.

10. A method according to claim 6, wherein the polycrystalline film is a multilayer stack composed of two or more layers, wherein the proportional ratio of A:B of adjacent layers is different from each other.

11. A method according to claim 10, wherein the misalignment angle of the layers is reduced from the bottom layer to the top layer.

* * * * *